United States Patent [19]

Suehiro

[11] Patent Number: 4,945,395
[45] Date of Patent: Jul. 31, 1990

[54] SEMICONDUCTOR DEVICE
[75] Inventor: Yoshiyuki Suehiro, Kawasaki, Japan
[73] Assignee: Fujitsu Limited, Kanagawa, Japan
[21] Appl. No.: 449,435
[22] Filed: Dec. 11, 1989

Related U.S. Application Data

[63] Continuation of Ser. No. 346,302, May 2, 1989, abandoned, which is a continuation of Ser. No. 84,050, Aug. 11, 1987, abandoned.

[30] Foreign Application Priority Data

Aug. 12, 1986 [JP] Japan .................. 61-189098

[51] Int. Cl.$^5$ ............................................. H01L 27/02
[52] U.S. Cl. ........................................ 357/40; 357/45
[58] Field of Search ................. 357/40, 45, 41, 23.13

[56] References Cited

U.S. PATENT DOCUMENTS

| | | | |
|---|---|---|---|
| 4,682,202 | 7/1987 | Tanizawa | 357/45 |
| 4,733,288 | 3/1988 | Sato | 357/45 |

FOREIGN PATENT DOCUMENTS 59-115540 3/1984 Japan .
60-251643 8/1985 Japan .
61-176136 1/1986 Japan .
62-4343 4/1987 Japan .

Primary Examiner—Andrew J. James
Assistant Examiner—Mark Prenty
Attorney, Agent, or Firm—Armstrong, Nikaido, Marmelstein, Kubovcik & Murray

[57] ABSTRACT

A semiconductor circuit comprises basic cells formed in an internal cell region on an integrated-circuit chip and pads for input/output cells, the pads being arranged in peripheral regions on said chip. The semiconductor circuit further comprises first logic circuit means provided for each of the input/output cells, each including logic circuits formed by transistors of relatively high drive capability which are a part of said respective input/output cells, the first logic circuit means being positioned in the perpheral regions. The present invention also comprises second logic circuit means provided for each of the input/output cells, each including remaining logic circuits of the respective input/output cells, the second logic circuit being formed by the basic cells formed in the internal cell regions, so that each of said input/output cells is formed by one pad and the combination of the first and second logic circuit means.

11 Claims, 4 Drawing Sheets

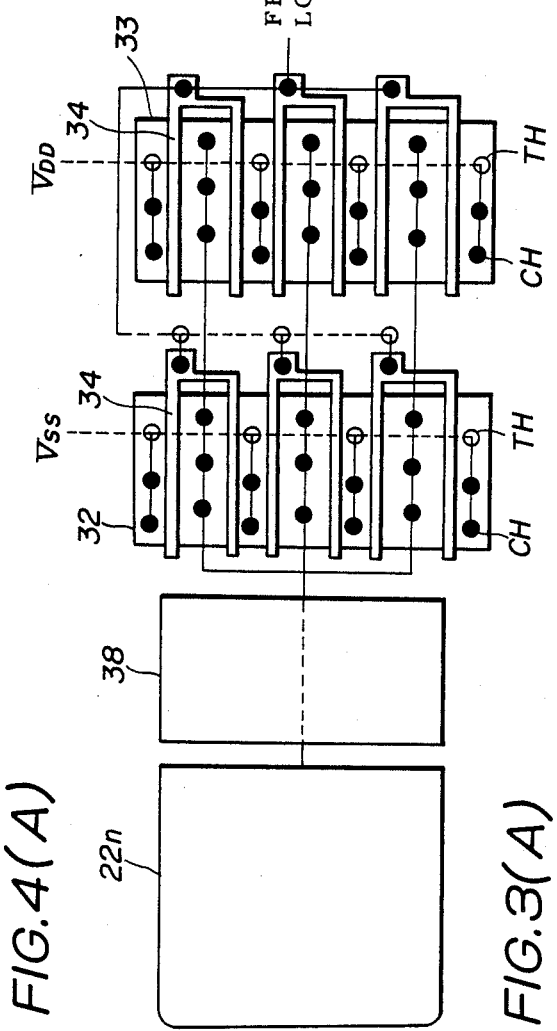
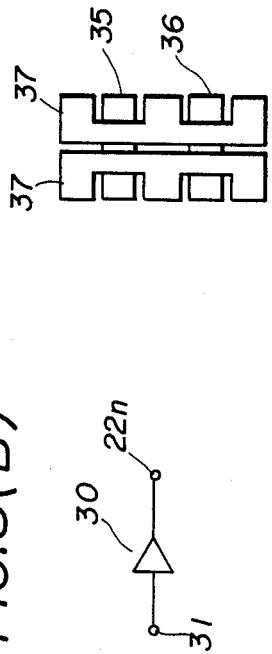
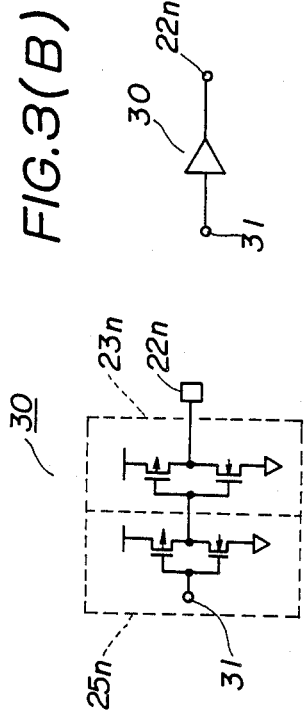
FIG.4(A)
FIG.4(B)
FIG.3(A)
FIG.3(B)

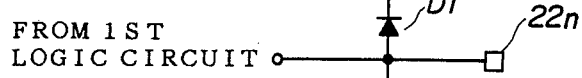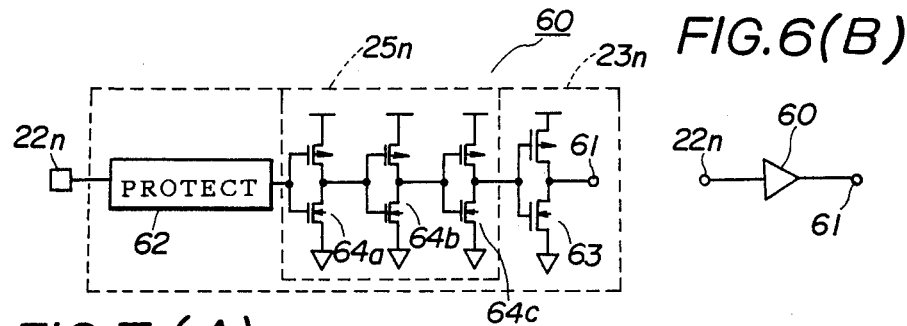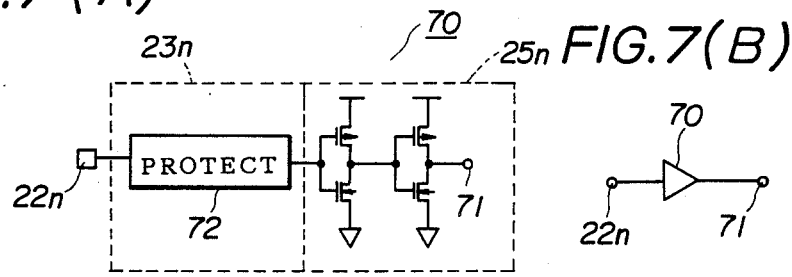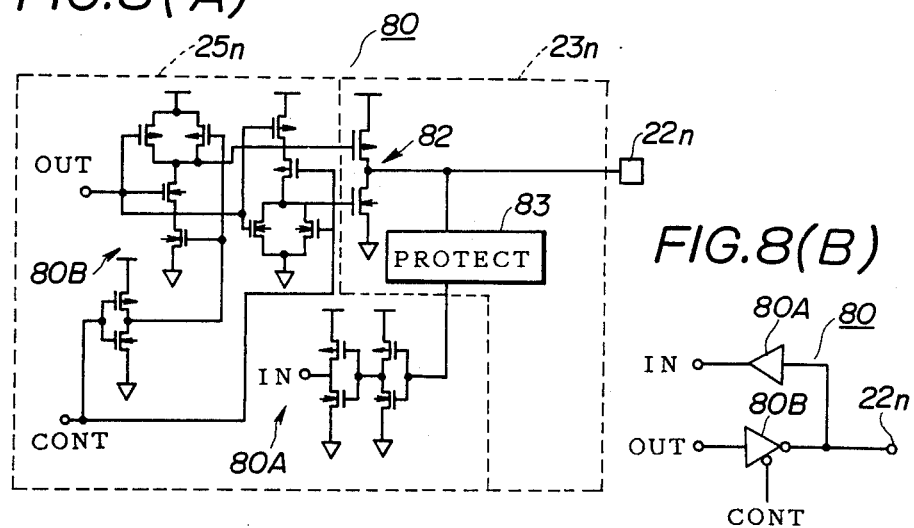

SEMICONDUCTOR DEVICE

This application is a continuation of application Ser. No. 346,302 filed May 2, 1989 now abandoned which is a continuation of application Ser. No. 084,050 filed Aug. 11, 1987 and now abandoned.

BACKGROUND OF THE INVENTION

The present invention generally relates to semiconductor devices, and in particular to master slice type integrated-circuit devices, which are capable of providing many kinds of logic circuits by carrying out desired interconnection for chips which are manufactured by common processes except a final interconnecting process. The present invention more particularly relates to improvements in input/output cells formed on chips in master slice type integrated-circuit devices such as a complementary metal oxide semiconductor gate array.

This type of semiconductor integrated-circuit device has a chip on which there are formed basic cells which are arranged in a matrix as well as input/output cells arranged around the basic cells. Each basic cell is generally composed of a plurality of transistors. The final interconnecting process has not yet been carried out for the basic cells. Therefore, desired logic circuits may be formed by interconnecting the transistors included in the basic cells. Input/output cells (hereafter referred to as I/O cells), which supply the logic circuits on the chip with signals from external circuits and/or feed output signals of the logic circuits to the external circuits, are arranged in peripheral regions on the chip. One I/O cell is generally made up of a protection circuit for absorbing over-voltage due to electrostatic discharge, a logic circuit having logic functions of an input buffer and/or an output buffer, and a bonding pad.

However, as will be described in detail later, the semiconductor devices aforementioned have disadvantages in that the number of I/O cells capable of being arranged in the chip peripheral regions is subject to some limitations and does not necessarily satisfy needs of customers. This is because all of the components forming the I/O cells are arranged in the peripheral regions on the chip, and therefore the size of each I/O cell is relatively large. In addition, it is difficult to arrange the I/O cells in regions on the chip very close to its corners, and to therefore utilize the chip corner regions efficiently. This leads to degradation in accuracy of a bonding process for connecting the bonding pads with corresponding lead patterns.

SUMMARY OF THE INVENTION

Accordingly, it is a general object of the present invention to provide a novel and useful semiconductor device, in which the above described problems have been eliminated.

Another and more specific object of the present invention is to provide a semiconductor device in which each I/O cell is divided into two logic circuits, one being located in chip peripheral regions and the other being formed by basic cells which are arranged in an internal cell region. That is, a semiconductor device according to the present invention comprises basic cells formed in an internal cell region on an integrated-circuit chip; pads for input/output cells, the pads being in peripheral regions on the chip; first logic circuit device provided for each of the input/output cells, each including logic circuits formed by transistors of relatively large drive capability which are a part of the respective input/output cells, the first logic circuit device being positioned in the peripheral regions; and second logic circuit device provided for each of the input/output cells, each including remaining logic circuits of the respective input/output cells, the second logic circuit being formed by the basic cells formed in the internal cell region, so that each of the input/output cells is formed by the pad and the combination of the first and second logic circuit devices.

Other objects and further features of the present invention will be apparent from the following detailed description when read in conjunction with the attached drawings.

BRIEF DESCRIPTION OF THE DRAWINGS

FIGS. 3(A) and 3(B) are respectively a circuit diagram and its equivalent circuit diagram of an I/O cell forming an output buffer employed in the semiconductor device shown in FIG. 2, FIG. 4(A) is a plan view of integrated-circuit patterns of a part of the output buffer in FIG. 3(A), FIG. 4(B) is a plan view of a basic cell arranged in an internal cell region in the semiconductor device in FIG. 2, FIG. 5 is a circuit diagram of a protection circuit in the semiconductor device in FIG. 2, FIGS. 6(A) and 6(B) are respectively a circuit diagram and its equivalent circuit diagram of an I/O cell forming an input buffer employed in the semiconductor device in FIG. 2, FIGS. 7(A) and 7(B) are respectively a circuit diagram and its equivalent circuit diagram of an I/O cell forming another input buffer employed in the semiconductor device in FIG. 2, FIGS. 8(A) and 8(B) are respectively a circuit diagram and its equivalent circuit diagram of an I/O cell forming a bi-directional buffer employed in the semiconductor device in FIG. 2.

DETAILED DESCRIPTION

Description will first be given of a conventional semiconductor integrated-circuit device to ensure a better understanding of the present invention which will be described in detail later.

Figure 1:
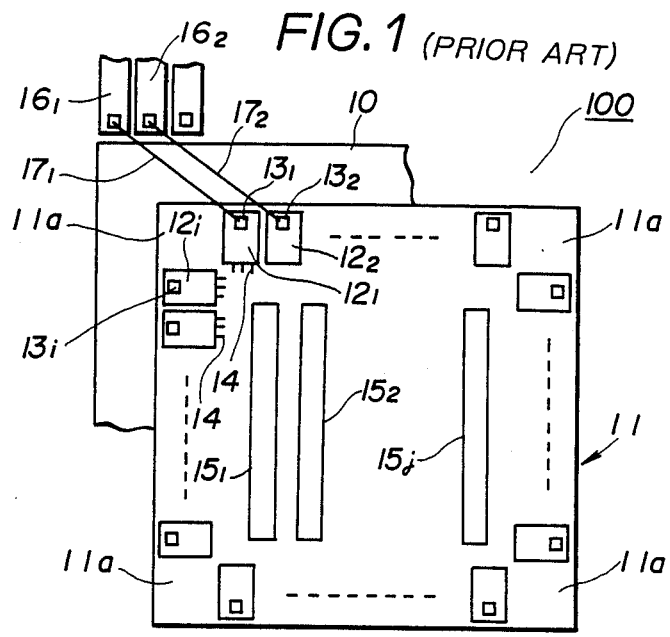
FIG. 1 is a plan view of a conventional semiconductor integrated-circuit device.

Referring to FIG. 1, an integrated-circuit chip 11 mounted on a die stage 10 of a package 100 has I/O cells $12_1, 12_2, \ldots, 12_i$, which are arranged in peripheral regions on the chip 11. Each I/O cell consists of a protection circuit for absorbing over-voltage resulting from electrostatic discharge, a logic circuit (not shown) having logic functions of an input buffer and/or an output buffer, and a bonding pad $13_1, 13_2, \ldots, 13_i$. In an internal region on the chip 11 which is surrounded by the arrangement of the I/O cells $12_1, 12_2, \ldots, 12_i$, there are arranged basic cell columns $15_1, 15_2, \ldots, 15_j$, each of which is formed by arranging basic cells in a predetermined direction. Each basic cell is composed of elements such as transistors. The interconnecting process for the basic cells is carried out according to customer requirements to form desired logic circuits such as NAND gates, flip-flops, and so on. The I/O cells $12_1$, $12_2, \ldots, 12_i$ are each connected to the respective basic cells by lines 14. The bonding pads $13_1, 13_2, \ldots, 13_i$ are connected to relative lead patterns $16_1, 16_2, \ldots$ with bonding wires $17_1, 17_2 \ldots$.

However, the above conventional semiconductor device has the disadvantages aforementioned. That is, the number of the I/O cells $12_1, 12_2, \ldots, 12_i$ is subject to limitations, as the size of each I/O cell is not necessarily small. This is because all the elements forming one I/O cell are positioned in the chip peripheral regions. Therefore, it is also impossible to locate the I/O cells $12_1$ and $12_i$ at positions closer to a chip corner 11a than their respective positions in FIG. 1. This means that the four chip corner areas 11a remain wasteful. Thus, the conventional semiconductor device cannot sufficiently satisfy customer requirement for the number of the I/O cell pins corresponding to the number of the I/O cells. In addition, the length of the bonding wires and an incident angle of the bonding wires with respect to the chip are limited to prevent bonding failure, because reliability of bonding is degraded due to dip of the bonding wires when the bonding wires are too long. In the configuration shown in FIG. 1, the I/O cells $12_1$ and $12_i$ are away from the corresponding interconnection patterns $16_1$ and $16_2$, and therefore the wires $17_1$ and $17_2$ are liable to be lengthened. Therefore, it is desirable to shorten these bonding wires and make the incident angle obtuse in light of facility and reliability of bonding.

The present invention mainly provides a semiconductor device in which the above problems have been eliminated.

Description will now be given of one example of a semiconductor device according to the present invention with reference to FIG. 2 which is a plan view thereof.

In peripheral regions on an integrated-circuit chip 21 mounted on a platform 20 of a semiconductor device 200, there are provided bonding pads $22_1, 22_2, \ldots, 22_n$ and first logic circuits $23_1, 23_2, \ldots, 23_n$. The bonding pads $22_1, 22_2, \ldots, 22_n$ are connected to corresponding interconnection patterns $26_1, 26_2, \ldots$ by bonding wires $27_1, 27_2, \ldots$. Each first logic circuit consists of a part of all the elements forming one I/O cell, and a protection circuit for absorbing over-voltage resulting from electrostatic discharge. The protection circuit is not necessarily needed especially for an output buffer. The bonding pads $22_1, 22_2, \ldots, 22_n$ are aligned with the corresponding first logic circuits $23_1, 23_2, \ldots, 23_n$. For example, the pad $22_1$ is aligned with the first logic circuit $23_1$ in the Y direction. In an internal cell region surrounded by the first logic circuits, there are formed basic cell columns $24_1, 24_2, \ldots, 24_m$ discretely arranged in the X direction. Each basic cell column is made up of a plurality of basic cells aligned in the Y direction. The basic cell columns $24_1, 24_2, \ldots, 24_m$ include second logic circuits $25_1, 25_2, \ldots, 25_n$, each of which consists of the remaining elements other than the elements of one I/O cell which are included in each of the first logic circuits $23_1, 23_2, \ldots, 23_n$. In other words, each second logic circuit is formed by the basic cells. The second logic circuits $25_1, 25_2, \ldots, 25_n$ are each connected to the respective first logic circuits $23_1, 23_2, \ldots, 23_n$.

As described previously, the circuit forming one I/O cell is divided into two parts, that is, the first logic circuit positioned in the chip peripheral regions and the second logic circuit formed by the basic cell or the basic cells in the basic cell columns. This arrangement makes it possible to increase the number of I/O cells mounted on the chip and to effectively reduce bonding failure, as will be described in detail later.

FIGS. 3(A) and 3(B) are respectively a circuit diagram and its equivalent circuit diagram of an I/O cell forming an output buffer in a semiconductor device according to the present invention. An output buffer 30 is consists of a two stage cascade configuration formed by metal oxide semiconductors (hereafter referred to as MOS). In detail, each stage includes a pair of complementary p-channel and n-channel MOS transistors. A pair of the complementary MOS transistors at the final stage form the first logic circuit $23_n$ of the I/O cell. A pair of the complementary MOS transistors which is followed by the final stage form the second logic circuit $25_n$. An input terminal 31 of the first stage is connected to a logic circuit in the basic cell columns, and an output terminal of the final stage is connected to the pad $22_n$.

In general, the power capacity of the transistors at the final stage must be much greater than that of the transistors in the previous stages. This is because the capacitance at output terminals (lead frames) of the semiconductor device is as large as 60 pF–100 pF, resulting from an external capacitance of a printed-circuit board or the like. It would therefore be difficult to form the transistors of high drive capability by means of the transistors of the basic cells in the basic cell columns. In general, the mutual conductance ($g_m$) of the transistors at the final stage of the output buffer is approximately ten to twenty times larger than that of the transistors of the basic cell. In view of the physical size of the chip, the transistors of the basic cell are of the order of tens of microns, whereas the transistors at the final stage are of the order of hundreds of microns. Therefore, it would be difficult not only to form the final stage transistors by the transistors of the basic cells but also to reduce the number of the basic transistors which are needed to form many kinds of the logic circuits such as NAND gates, flip-flops and so forth. In the light of these points, the present invention intends to divide one I/O cell circuit into two parts, that is, the first logic circuit positioned together with one bonding pad in the chip peripheral regions, and the second logic circuit formed by the basic cells in the internal cell region.

Figure 2:
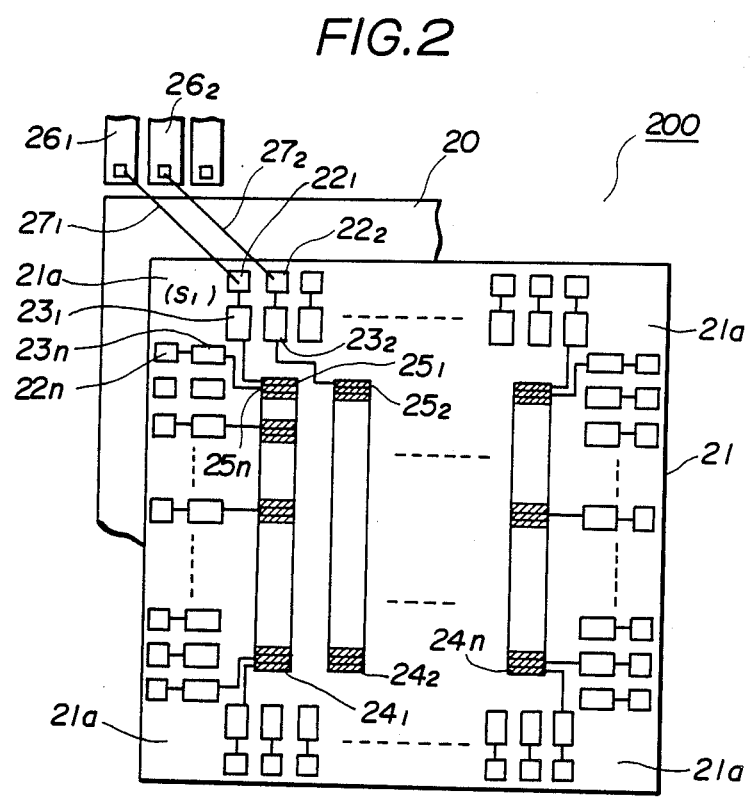
FIG. 2 is a plan view of one example of a semiconductor integrated-circuit device according to the present invention.

FIGS. 4(A) and 4(B) is an enlarged plan view of a part of the chip illustrated in FIG. 2. The first logic circuit $23_n$ includes a n-channel MOS transistor region 32 in which drains/sources are formed, and a p-channel MOS transistor region 33 in which drains/sources are formed. The width of these regions is nearly equal to that of the pad $22_n$. Gate electrodes 34 are mounted on the n- and p-channel regions 32 and 33. Symbols indicated by characters CH represent contacts holes, which form contacts between a first layer metallization illustrated by solid lines and source/drain regions 32 and 33. Also, symbols indicated by characters TH represent through holes, which forms contacts between the first layer metallization and a second layer metallization illustrated by broken lines. As illustrated in FIG. 4(A), the first logic circuit $23_n$ is formed by mutually connecting the gate electrodes 34 and commonly connecting drains in the n- and p-channel regions 32 and 33. A plurality of transistors (six in this example) in each of n- and p-channel regions 32 and 33 are connected in parallel. The interconnection described above is carried out by using masks for the contact holes CH, the through holes TH, the first metallization and the second metallization. That is, a pair of n- and p-channel transistors at the final stage of the output buffer in FIG. 3(A) are formed by the combination of a plurality of n-channel transistors connected in parallel and a plurality of p-channel transistors connected in parallel. It is very effective to prepare several n-channel and p-channel transistors for each I/O cell and to connect some or all of these transistors with each other in parallel. This is because the capability of the I/O cell for driving loads can be enhanced, and also the degree of freedom of design of the I/O cells can be made high. Of course, it is possible to arrange a single n-channel transistor of the relatively high drive capability in the n-channel transistor region 32, and a single p-channel transistor of the relatively high drive capability in the p-channel transistor region 33.

The second logic circuit $25_n$ of the I/O cell is formed as shown in FIG. 4(B). One basic cell has a n-channel region 35, a p-channel region 36 and gate electrodes 37 laid over these regions. In this example, one basic cell is formed by the combination of two n-channel transistors and two p-channel transistors.

Turning now FIG. 4(A), a protection circuit area 38 is provided between the bonding pad $22_n$ of substantially square shape and the n-channel transistor region 32. Although the output buffer 30 shown in FIG. 3(A) does not have the protection circuit for absorbing overvoltage resulting from electrostatic discharge, it is preferable to provide the protection circuit in the protection circuit area 38 for each I/O cell. This is why the structure shown in FIG. 4(A) is applicable not only to the output buffer but also to an input buffer or an input/output buffer, which will be described later. When using the protection circuit, the first logic circuit $23_n$ consists of the protection circuit and the transistors at the final stage of the output buffer 30.

FIG. 5 is a circuit diagram of one example of a protection circuit formed in the protection circuit area 38 in FIG. 3(A). The protection circuit illustrated is formed by series-connected diodes $D_1$ and $D_2$ between ground and the power supply (not shown). That is, the anode of the diode $D_2$ and the cathode of the diode $D_1$ are connected to ground and the power source, respectively. The anode of the diode $D_1$ and the cathode of the diode $D_2$ is connected to the pad $22_n$ and the first logic circuit $23_n$, if the protection circuit is used for the output buffer 30 in FIG. 3(A).

FIGS. 6(A) and 6(B) are respectively a circuit diagram and its equivalent circuit diagram of an I/O cell forming an input buffer in the semiconductor device in FIG. 2. An input buffer 60 is of a four stage cascade configuration with MOS transistors. Each stage of the input buffer 60 is composed of a pair of a p-channel MOS transistor and a n-channel MOS transistor. The first logic circuit $23_n$ of the input buffer 60 consists of a protection circuit 62 connected to the pad $22_n$ and a transistor logic circuit 63 at the final (or fourth) stage, whereas the second logic circuit $25_n$ consists of transistor logic circuits 64a, 64b and 64c at the first, second and third stages. An output terminal 71 of the final stage is connected to logic circuits (not shown) such as flip-flops.

The input buffer 60 in FIG. 6(A) is a clock input buffer which drives flip-flops formed by the basic cells in the basic cell columns. In general, one clock input buffer supplies approximately 50-100 flip-flops with a clock signal. Therefore, the load of the final stage transistors of the clock input buffer is relatively high, so that it becomes necessary to use the transistors of the relatively high drive capability. For example, the mutual conductance of the final stage transistors is approximately ten to twenty times larger than the transistors of the first stage. Therefore, it is difficult to form the final stage transistors with the combination of the basic cells. Also, this leads to the reduction of the number of the basic cells which form many kinds of logic circuits such as NAND gates, flip-flops and so on in accordance with customer requirements. Therefore, according to the present invention, the first logic circuit $23_n$ consisting of the protection circuit 62 and the transistor circuit 63 are arranged in the chip peripheral regions, whereas the second logic circuit $25_n$ consisting of the transistor circuits 64a, 64b and 64c is positioned at the first through third stages in the basic cell column $24_m$.

The transistor circuit 63 at the final stage of the input buffer 60 may be formed in a similar manner to in the transistor circuit at the final stage shown in FIG. 4(A). That is, the n-channel and p-channel transistors of the transistor circuit 63 in FIG. 6(A) are respectively formed with a plurality of n-channel transistors connected in parallel and a plurality of p-channel transistors connected in parallel. Of course, a single n-channel transistor and a single p-channel transistor may be employed. However, the degree of freedom of design of the semiconductor device where the parallel connection of the transistors is employed to form the final stage transistors is higher than that of the semiconductor device using a single transistor for each channel. The protection circuit 62 may have the same circuit structure as that in FIG. 5.

Further, the transistor circuit 64a at the first stage acts as a level shifter, and the transistor circuits 64b and 64c act as amplifier circuits. Each of the transistor circuits 64a, 64b and 64c may be formed by the basic cell shown in FIG. 4(B) or its combination. In particular, the transistor circuit 64c at the third stage needs transistors more powerful than the transistors at the first or second stage, because the transistor circuit 64c drives the transistor circuit 63 at the final stage. Therefore, the transistor circuit 64c is preferably formed by the combination of the basic cells connected in parallel.

FIGS. 7(A) and 7(B) are respectively a circuit diagram and its equivalent circuit diagram of an I/O cell forming another input buffer employed in the semiconductor device in FIG. 2. An input buffer 70 is an input buffer of a relatively low drive capability. Therefore, only a protection circuit 72 is formed as the first logic circuit $23_n$, while transistor circuits of the two stage cascade connection are formed as the second logic circuit $25_n$. The input terminal of the protection circuit 72 is connected to an input terminal of the first stage, and an output terminal 71 of the final stage is connected to logic circuits (not shown) in the basic cell columns $24_1$, $24_2$, ..., $24_m$.

FIGS. 8(A) and 8(B) are respectively a circuit diagram and its equivalent circuit diagram of an I/O cell forming an input/output buffer (bi-directional buffer) in the semiconductor device in FIG. 2. An input/output buffer 80 is composed of an input buffer 80A and an output buffer 80B. The first logic circuit $23_n$ positioned in the chip peripheral regions consists of a transistor circuit 82 at the final stage of the output buffer 80B as well as a protection circuit 83. The second logic circuit $25_n$ consists of the remaining transistor circuits of the output buffer 80B other than the transistor circuit 82 included in the first logic circuit $23_n$, as well as all transistor circuits forming the input buffer 80A. Characters IN indicates an input terminal of the input buffer 80A, OUT indicates an output terminal of the output buffer 80B and CONT represents a terminal to which a control signal for selecting one of two states of the output buffer 80B, or a high impedance state (a disabled state) and a low impedance state (a enabled state). The first logic circuit $23_n$ consisting of the transistor circuit 82 and the protection circuit 83 may be formed in a similar manner as illustrated in FIG. 4(A), while the second logic circuit $25_n$ may be formed by the combination of the basic cell illustrated in FIG. 4(B).

The arrangements discussed in the foregoing, in which one I/O cell is divided into two logic circuits provides the following advantages.

Figure 9:
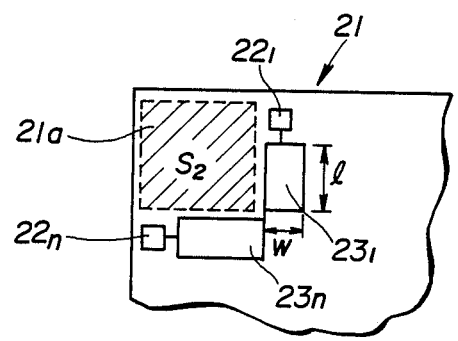
FIG. 9 is a plan view of a chip corner part of the semiconductor device in FIG. 2.

Referring to FIG. 9, which is an enlarged plan view of one chip corner part of the semiconductor device shown in FIG. 2, the first logic circuit $23n$ arranged in the chip peripheral regions consists of the transistors of the relatively high drive capability and the protection circuit. Therefore, according to the present invention, it is possible to reduce the size of the I/O cells arranged in the chip peripheral regions. In detail, the width w and the length l of the I/O cell $23_1$ can be made small, as compared with the I/O cell $12_1$. Therefore, it is possible to arrange many more I/O cells on the chip. In other words, the present invention makes it possible to position the I/O cells in the chip corner regions more closely to the chip corners. This means that the area $S_2$ of the chip corner region $21a$ can be made smaller than the area $S_1$ of the chip corner region $11a$. Thus, it is also possible to utilize the chip corner regions $21a$ efficiently. Moreover, the above arrangements make it possible to shorten the length of the bonding wire $27_1$ (FIG. 2) extending between the pad $22_1$ of the I/O cell in the chip corner region $21a$ and the corresponding interconnection pattern $26_1$, compared with the conventional arrangement of the I/O cell. In other words, it is possible to decrease the incident angle of the bonding wire and to thus improve accuracy of the bonding process. The improvement in accuracy of the bonding process is very important to the master slice type semiconductor devices, which can provide many kinds of the logic circuits by using the chip having common configurations but different interconnections.

Figure 10:
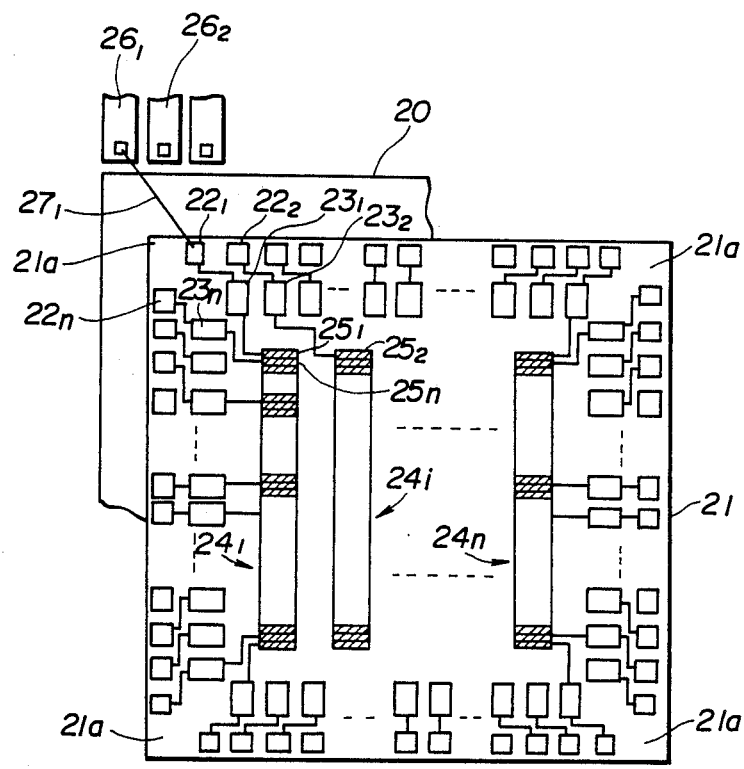
FIG. 10 is a plan view of another example of a semiconductor device according to the present invention.

FIG. 10 is a plan view of a variation of the semiconductor device illustrated in FIG. 2. One of the essential features of this variation is to position only the pads in the chip corner regions $21a$ and their vicinity closer to the chip corners than the arrangement in FIG. 2. For example, the pad $22_1$ in FIG. 10 is positioned closer to the chip corner than the pad $22_1$ in FIG. 2. However, the first logic circuit $23_1$ of the I/O cell corresponding to the pad $22_1$ remains at its original location shown in FIG. 2. The arrangement in FIG. 10 makes it possible to further improve accuracy of the bonding process, as compared with that in FIG. 2. Of course, the variation includes all of the essential features provided by the configuration in FIG. 2.

Embodiments according to the present invention have been described in detail. In the embodiment aforementioned, the first logic circuit $23_n$ consists of the transistors of relatively high drive capability and the protection circuit if necessary. However, when the present invention is applied to a semiconductor device which has pull-up/-down resistors in the I/O cells, it is preferable to include them in the first logic circuit located in the chip peripheral regions. This is why these resistors are of the size considerably larger than the basic cells.

The present invention is not limited to the embodiments, but various variation and modification may be made without departing form the scope of the present invention.

What is claimed is:

1. A semiconductor device comprising:
   an integrated-circuit chip having an internal cell region and peripheral regions surrounding said internal cell region;
   basic cells formed in said internal cell region on said integrated-circuit chip;
   pads for input/output cells used for interfacing with an external device, said pads being arranged in outer portions of the peripheral regions on said chip;
   first logical circuit means provided for each of said input/output cells, each including logic circuits formed by transistors which are a part of said respective input/out cells, said first logic circuit means being positioned in inner portions of said peripheral regions, said transistors in said logic circuits having a drive capability higher than that of a transistor formed by said basic cells, said first logic circuit means being arranged along four edges of said integrated-circuit chip, said first logic circuit means including protection circuit means for protecting said related input/output cell against an over-voltage resulting from electrostatic discharge; and
   second logic circuit means provided for each of said input/output cells, each including remaining logic circuits of said respective input/output cells, said second logic circuit means being formed by said basic cells formed in said internal cell regions, so that each of said input/output cells is formed by one pad and the combination of said first and second logic circuit means.

2. A semiconductor device as claimed in claim 1, wherein the mutual conductance of transistors forming said logic circuits included in said first logic circuit means is approximately ten to twenty times larger than of transistors forming said logic circuits included in said second logic circuit.

3. A semiconductor device as claimed in claim 1, wherein said first logic circuit each comprises a protection circuit for protecting said first and second logic circuits against over-voltage resulting from electrostatic discharge.

4. A semiconductor device as claimed in claim 1, wherein said transistors included in said first logic circuit is formed by the combination of transistors connected in parallel.

5. A semiconductor device as claimed in claim 1, wherein said first logic circuit means and said relative pad for each input/output cell are aligned.

6. A semiconductor device as claimed in claim 1, wherein a part of said pads located in the vicinity of corners of said chip are located at positions closer to said chip corners than positions of said corresponding first logic circuit means.

7. A semiconductor device comprising:
   an integrated-circuit chip having an internal cell region and peripheral regions surrounding said internal cell region;

basic cells formed in said internal cell region on said integrated-circuit chip;

pads for input buffer cells for cascade-connected transistors, said pads being arranged in outer portions of said peripheral regions on said chip, input buffer cells being used for receiving a signal from an external device;

first logic circuit means provided for each of said input buffer cells, each including a transistor circuit having transistors at a final stage of said respective input buffer cells as well as a protection circuit means connected to said corresponding pad for protecting said respective input buffer cells, said first logic circuit means being positioned in inner portions of said peripheral regions, said transistors of said transistor circuit having drive capability higher than that of a transistor formed in said basic cells, said first logic circuit means being arranged along four edges of said integrated-circuit chip, said protection circuit means for protecting said related input cell against an over-voltage resulting from electrostatic discharge; and second logic circuit means provided for each of said input buffer cells, each including remaining transistor circuits of said respective input buffer cells, said second logic circuit being formed by said basic cells formed in said internal cells regions, an output of said second logic circuit means being connected to an input of said first logic circuit means, so that each of said input buffer cells is formed by one pad and the combination of said first and second logic circuit means.

8. A semiconductor circuit as claimed in claim 7, wherein said transistors forming said final stage in each of said first logic circuit means are formed by transistors connected in parallel.

9. A master slice type integrated circuit device comprising:
a basic cell array having a plurality of basic cells each including first MOS transistors;
a plurality of input/output cells arranged around said basic cell array, each of said input/output cells including
an input/output electrode,
an electrostatic protection element protecting said input/output cell against an over-voltage from electrostatic discharge, and
second MOS transistors each having a driveability larger than that of each of said first MOS transistors included in each of said basic cells; and
at least one input interface circuit formed by
each electrostatic protection element coupled to said input/output electrode,
a first circuit formed by said second MOS transistors of said input/output cell, and
a second circuit formed by said first MOS transistors of said basic cells and having an output terminal coupled to said electrostatic protection circuit and an input terminal coupled to said first circuit.

10. A master slice type integrated circuit device comprising:
a basic cell array having a plurality of basic cells each including first MOS transistors;
a plurality of input/output cells arranged around said basic cell array, each of said input/output cells including
an input/output electrode,
an electrostatic protection element protecting said input/output cell against an over-voltage from electrostatic discharge, and
second MOS transistors each having a driveability larger than that of each of said first MOS transistors included in each of said basic cells;
at least one bidirectional input/output interface circuit formed by
said electrostatic protection element coupled to said input/output electrode,
an input circuit formed by said first MOS transistors of said basic cells and coupled to said electrostatic protection circuit,
an output circuit formed by said second MOS transistors of said input/output cell and having an output terminal coupled to said input/output electrode and an input terminal; and
a control circuit formed by said first transistors of said basic cells and coupled to the input terminal of said output circuit.

11. A master slice type integrated circuit device comprising:
a basic cell array having a plurality of basic cells each having a pair of P-channel MOS transistor and N-channel MOS transistor;
a plurality of input/output cells arranged around said basic cell array, each of said input/output cells including
an input/output electrode,
an electrostatic protection element, and
a pair of P-channel MOS transistors and N-channel MOS transistor having driveabilities larger than those of said P-channel MOS transistor and said N-channel MOS transistor of said basic cell;
at least one input/output interface circuit formed by said electrostatic protection element,
said pair of P-channel MOS transistor and N-channel MOS transistor of said basic cell, and
said pair of P-channel MOS transistor and N-channel MOS transistor of said input/output cell, which are coupled by wiring lines.

* * * * *